United States Patent [19]
Jeon et al.

[11] Patent Number: 5,727,029
[45] Date of Patent: Mar. 10, 1998

[54] BRANCH METRIC MODULE IN VITERBI DECODER

[75] Inventors: In-San Jeon; Ik-Su Eo; In-Ki Lim; Kwang-Il Yeon; Jae-Seok Kim, all of Daejeon, Rep. of Korea

[73] Assignee: Electronics and Telecommunications Research Institute, Daejeon-shi, Rep. of Korea

[21] Appl. No.: 575,076

[22] Filed: Dec. 19, 1995

[30] Foreign Application Priority Data

Dec. 23, 1994 [KR] Rep. of Korea ............... 94-36349

[51] Int. Cl.⁶ .................... H03D 1/00; H04L 27/06
[52] U.S. Cl. ........................ 375/341; 375/262
[58] Field of Search ................. 375/341, 262; 371/43; 275/340

[56] References Cited

U.S. PATENT DOCUMENTS

| | | |
|---|---|---|
| 4,606,027 | 8/1986 | Otani .................... 371/43 |
| 5,027,374 | 6/1991 | Rossman. | 
| 5,295,142 | 3/1994 | Hatakeyama. |
| 5,432,803 | 7/1995 | Liu et al. .................... 375/340 |
| 5,539,757 | 7/1996 | Cox et al. .................... 371/43 |

OTHER PUBLICATIONS

Park, et al.: "Implementation Of A Viterbi Decoder For CDMA Digital Cellular Systems", pp. 551–554; Proceedings of JTC–CSCC 1994.

*Primary Examiner*—Stephen Chin
*Assistant Examiner*—Hai H. Phan
*Attorney, Agent, or Firm*—Jacobson, Price, Holman & Stern, PLLC

[57] ABSTRACT

The present invention relates in general to a channel CODEC to increase the transmitting effect on a communication channel of a communication system, and more specifically to a branch metric module of a viterbi decoder. The module includes an operator for operating and outputting the differential magnitude of two signals, one signal being a code word generated to perform the viterbi decode and the other being a signal transmitted through the channel. An adder sums and outputs the data which is outputted to it from the operator. A receiving code word converter converts the magnitude of any of bits by the linear sampling quantization process, and non-linearly converts it in accordance with a preestimated or predetermined format. A number of operators calculate the magnitude between two signals at the absolute value to convert the magnitude of an inputted generative code word and the magnitude of the non-linear converted receiving code word. The adder sums and outputs the result to a branch metric converter, which converts the output according to the preestimated format.

10 Claims, 4 Drawing Sheets

BRANCH METRIC MODULE IN VITERBI DECODER

TECHNICAL FIELD OF INVENTION

The present invention relates in general to a channel CODEC to increase the transmission effect on a communication channel in a communication system, and more particularly to the improved structure of a branch metric module that is part of a viterbi decoder.

BACKGROUND OF THE INVENTION

Generally, a digital communication system is comprised of a transmitting portion for transmitting data containing certain information through a communications channel, and a receiving portion for receiving selected data containing the desired information through the channel, as shown in FIG. 1.

The transmitting portion is comprised of a source coder 100, a channel coder 110, a modulator 120, etc., and the receiving portion is comprised of a demodulator 200, a channel decoder 210, a source decoder 220, etc.

In a digital mobile communication system with the structure as mentioned hereinabove, combining the modulator 120 and the demodulator 200 is referred to as a modem, which is an apparatus for transmitting data modulated into a diffused frequency band on a carrier frequency, and for receiving and demodulating the data.

Combining channel coder 110 and channel decoder 210 is referred to as a channel CODEC, in which the representative method on the coding method which is used to construct the channel CODEC is widely classified by the block code and the convolution code.

The reason for providing the coding method as mentioned hereinabove is because it is necessary to correct an error caused in the channel transmission.

Recently, the coding method which is widely used in the field for correcting an error occurring in the channel of a digital communication system is now being used in code division multiple access (CDMA) digital cellular systems, and also used in satellite communication systems.

The decoder used in the prior art when the coder uses a conventional code generally uses a viterbi decoder.

Referring to FIG. 2 which illustrates the general structure of the viterbi decoder, the viterbi decoder is comprised of an input buffer module 10, a branch metric module 20, a path metric module 30, a quantization module 40, a trace back module 50, and an output buffer module 60.

Summarizing the function of each of the structured components mentioned hereinabove, the branch metric module 20 calculates the inputted, received word and the branch metric value of which are the difference value of the code word value of the branch connected the trellis diagram to each of the state, and provides them to the path metric module 30.

The path metric module 30 inputs the branch metric information which is outputted from the branch metric module 20, selects the small value after the branch metric value which is connected between the current stage of the trellis diagram to each of the states is summed up the path metric of the state connected to the branch, determines the new path metric of the next stage, and then provides it to the quantization module 40.

The quantization module 40 stores the smallest path metric value by subtracting all of the path metric values from the smallest value of the path metric values which is calculated in and outputted by the path metric module 30.

The trace back module 50 searches the state which has the smallest path metric value in the current stage of the trellis diagram, and detects the original input information without an error by performing the trace back algorithm using it as the initial value. The input buffer module 10 and the output buffer module 60 are also necessary to connect the viterbi decoder to the outside environment, and are constructed to depend upon the digital communication system in which the viterbi decoder is applied.

The code rate R in the viterbi decoder structured as mentioned hereinabove is ⅓, and the general branch metric module 20 is comprised of a code word generator 21 for generating the code words to perform the viterbi decode if it is the four bits soft-decision as shown in FIG. 3. The four bit output operators 23 are used for calculating the magnitude of each of the differences of the code word (referred to below as "generative code word") with the code words (referred to below as "receiving code word") to be received through the transmission line by a receiving code word terminal 22. Three six bit adders 24 are used for summing the magnitude of the difference of each of the code words to calculate the branch metric.

Referring to FIG. 3, $C_{g0}$, $C_{g1}$, $C_{g2}$ are referred to as the generative code word which is generated by code word generator 21.

Each of the generative code words illustrates the signed 2's complement of four bits including the code bit, and has a value between 7 (0111) and −7 (1001).

$C_{r0}$, $C_{r1}$, $C_{r2}$ are the receiving code word from a terminal 22 of the viterbi decoder.

Each of the receiving code words illustrates the signed 2's complement of four bits including the code bit, and has the value between 7(0111) and −7(1001).

Then, each of the operators 23 receives the generative code word and the receiving code word, and performs the operation as given by the following equation 1.

$$C_g o C_r = |C_g - C_r| \qquad (1)$$

That is, the operator "o" calculates the difference of two code words (one generative code word and one receiving code word), and provides the absolute value thereof.

The value which is obtained by the performance of the operator "o" as mentioned hereinabove indicates the length between one generative code word and one receiving code word.

The adder 24 sums the length between the interest words, and calculates the branch metric (BM) using the following equation.

$$\begin{aligned} BM &= CM_0 + CM_1 + CM_2 \qquad (2)\\ &= (C_{g0} o C_{r0}) + (C_{g1} o C_{r1}) + (C_{g2} o C_{r2})\\ &= |C_{g0} - C_{r0}| + |C_{g1} - C_{r1}| + |C_{g2} - C_{r2}| \end{aligned}$$

The branch metric (BM) which is calculated by equation 2 as mentioned hereinabove is used to calculate the path metric.

The conventional method for calculating the branch metric as mentioned hereinabove is to calculate the branch metric under the assumption that an error included in the receiving signal is the same, and is applied to quantize equidistantly when the signal receiving through the channel is quantized.

However, under the assumption that the signal which is received through the additive white gaussian noise (AWGN)

in the digital communication system is the same as the signal as shown in FIG. 4(A), the value around both ends +7(0111) and −7(1001) of the four bit soft-decided receiving code word, which is inputted to the branch metric module, has the feature in which the probability that there is an included error is low, and the value around the central +1(0001), 0(0000), and −1(1111) is such that the probability that there an included error is relatively high.

The conventional branch metric module for applying the linear quantization method which equidistantly divides the receiving signal as shown in FIG. 4(B) is the problem by which the performance of the system due to the feature mentioned hereinabove is depreciated.

SUMMARY OF THE INVENTION

It is an object of the present invention to solve the problem as mentioned hereinabove, and to provide the branch metric module of the viterbi decoder which does not greatly change the full structure of the system so that the non-linear quantization method in accordance with the density of the probability to be included an error can be applied.

It is a feature or characterization of the invention to accomplish the objects as noted above comprising the branch metric module of the viterbi decoder including the operator of any of bits operating and outputting the differential magnitude of two signals which the code word generated to perform the receiving code word and the viterbi decode word generated by demodulating the signal transmitted through the channel are inputted, and the adder summing and outputting the data which is outputted from said operators comprises a receiving code word converter means for inputting said receiving code word generated by the linear sampling quantization process, converting and outputting the magnitude of any of bits, and non-linearly converting and outputting it in accordance with the preestimated format, a number of operator means for calculating the magnitude between two signals at the absolute value to convert the bit magnitude of said generative code word which the bit magnitude of the non-linear converted receiving code word outputted from said receiving code word converter means is inputted; an adder means for summing and outputting to input the absolute value calculated from said operator means; and a branch metric converter means for converting and outputting the branch 'Metric' data outputted from said adder means into the bit magnitude of said generative code word according to the preestimated format.

BRIEF DESCRIPTION OF THE DRAWINGS

These and other objects of the present invention will no doubt become apparent to those skilled in the art after having read the detailed description of the presently preferred method and system of the present invention which are illustrated in the figures of the drawing.

DETAILED DESCRIPTION OF THE INVENTION

Figure 3:
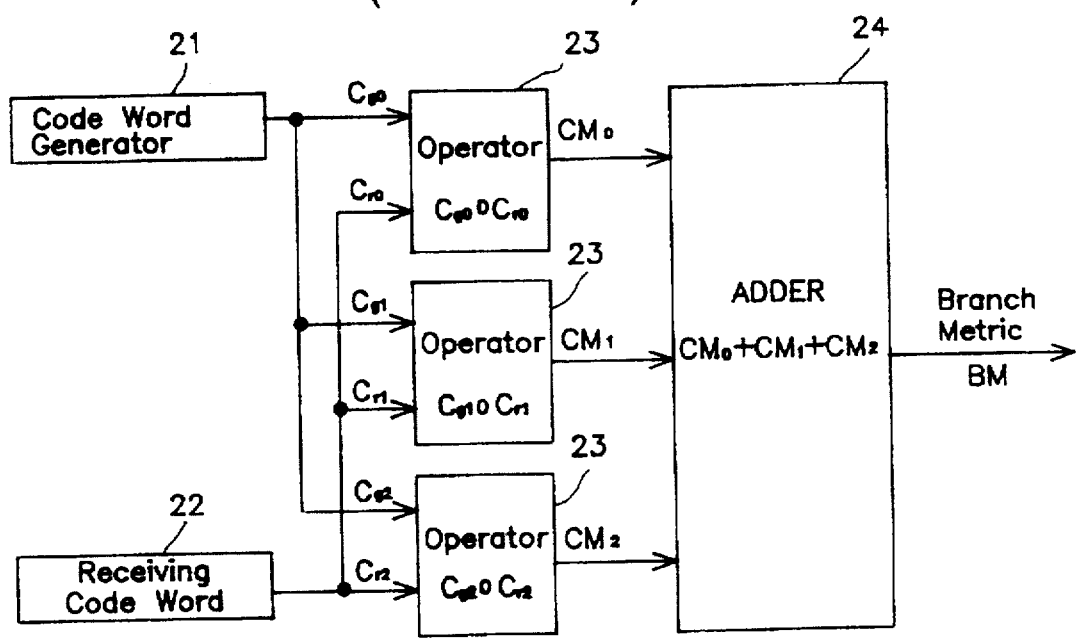
FIG. 3 illustrates the general structure of the branch metric module of FIG. 1.

First, accounting for the technical event of the present invention, simply, the changing value of the branch metric (BM) of the output signal of an adder 24 as shown in FIG. 3 has a data change from the minimum value of 0 to the maximum value of 42 in accordance with the equation 2. This is because the maximum magnitude of the value of $CM_0$ from the output of each of the operators 23 according to equation 1 has a magnitude of 14 when $C_{g0}$ is 7 and $C_{r0}$ is −7, or when $C_{g0}$ is −7 and $C_{r0}$ is 7, and the three outputs are added together by adder 24. Thus, 3 time 14 equals 42.

Figure 4A:
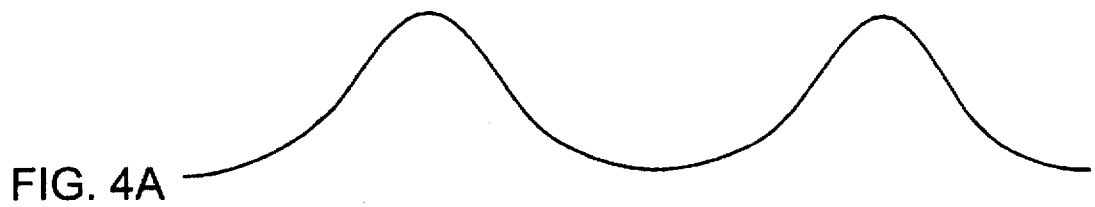
FIGS. 4a, 4b and 4c illustrate a wave form of a signal received in the digital communication system and the quantization levels of that wave form.
Figure 4B:
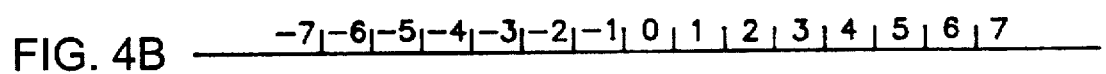
Figure 4C:
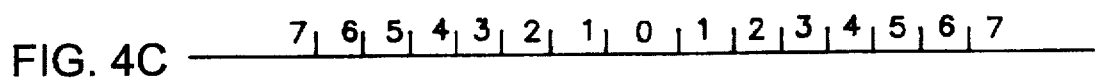
Figure 5:
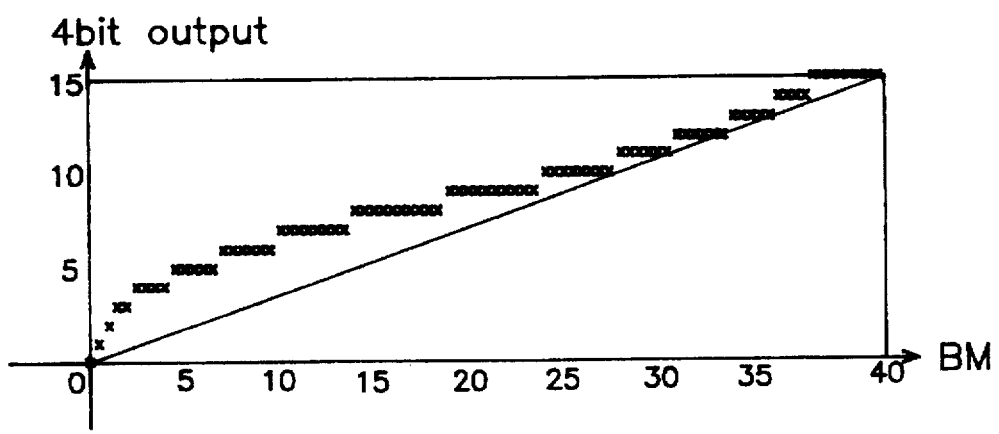
FIG. 5 illustrates the relationship between the linear method of the branch metric output and the real data.

FIG. 5 illustrates the relationship between the changing values of the branch metric (BM) which are the timed output signals of the adder 24 as mentioned hereinabove and the four bit output value thereof. In FIG. 5 the X-axis indicates the branch metric which is the output signal of adder 24, and the Y axis indicates the four bit output value, and the corresponding relationship between the changing amount of the X axis and the changing amount of the Y axis, indicated by the lines of x's, is the relationship in the reference of the quantization as shown in FIG. 4(B).

However, the real corresponding relationship has the coordinate value which is indicated by the X's, and can be seen to have a non-linear relationship rather than the linear relationship as indicated the solid line.

The description for the difference of both the linear relationship and the non-linear relationship can be seen in the description of the problem according to the conventional techniques, and for the additional description of an object of the present invention, the receiving code word which can be obtained by the linear quantization of the receiving signal is put to the branch metric module and it take the method of converting the linear quantized receiving code word considering the feature of the receiving signal and the branch metric.

That is, the change of the central portion of a receiving code word where the probability that an error may be generated is large decreases the effect for the branch metric, and the change at both end portions of the receiving code word where the probability that an error may be generated is small decreases the effect for the branch metric, thereby sufficiently reflecting the change around between +4 (0100) and −4 (1100) to the branch metric.

Considering the feature of the branch metric value calculated through the above-mentioned process, the receiving code word has a probability of an error that is large if the branch metric value is large, has a probability of an error that is small if the branch metric value is small, and the meaning of the central value has an ambiguousness that is larger that the receiving code word can be or not the transmitted code word.

Therefore, the branch metric module according to the present invention is such that the branch metric value around the maximum value has the greatest value, the branch metric value having the value around the minimum value has a more divided value, the ambiguous portion is small compared to the change of the branch metric value, and the remainder portion sufficiently reflects the change of the branch metric. Thus, the performance of the viterbi decoder can be improved.

Figure 1:
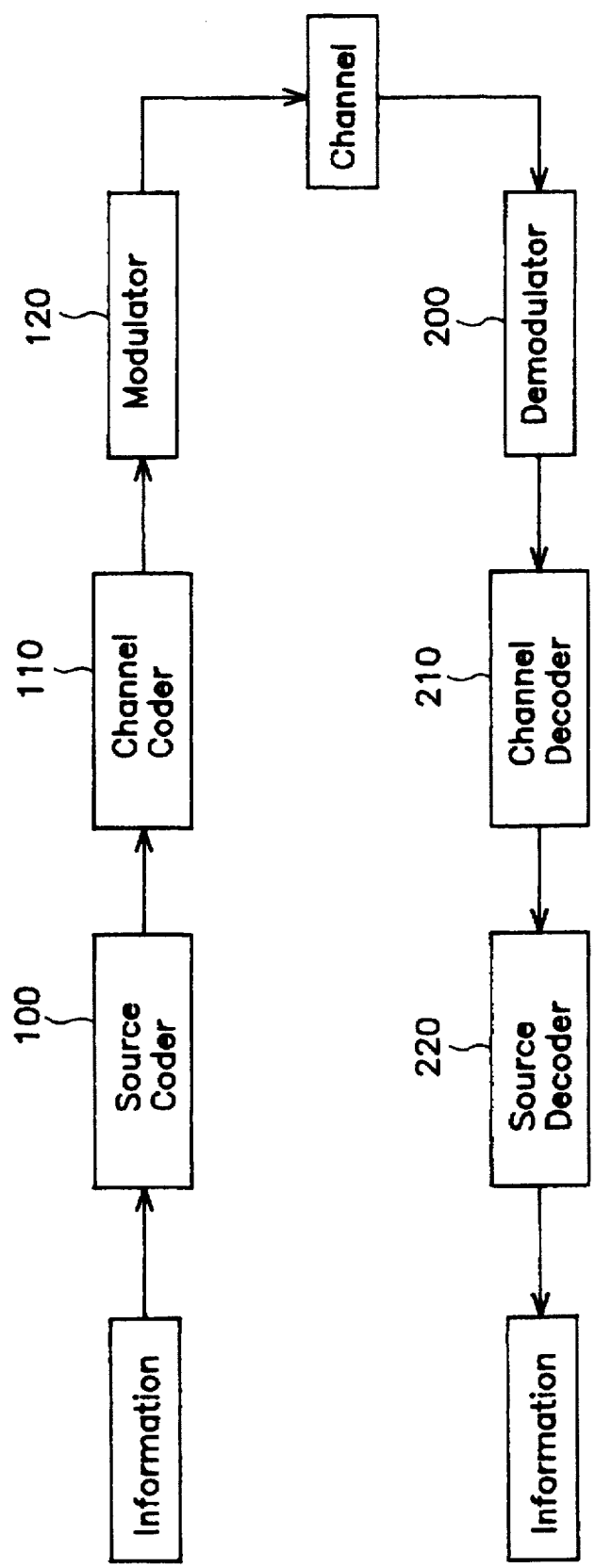
FIG. 1 is a block diagram schematically illustrating the general digital communication system.
Figure 2:
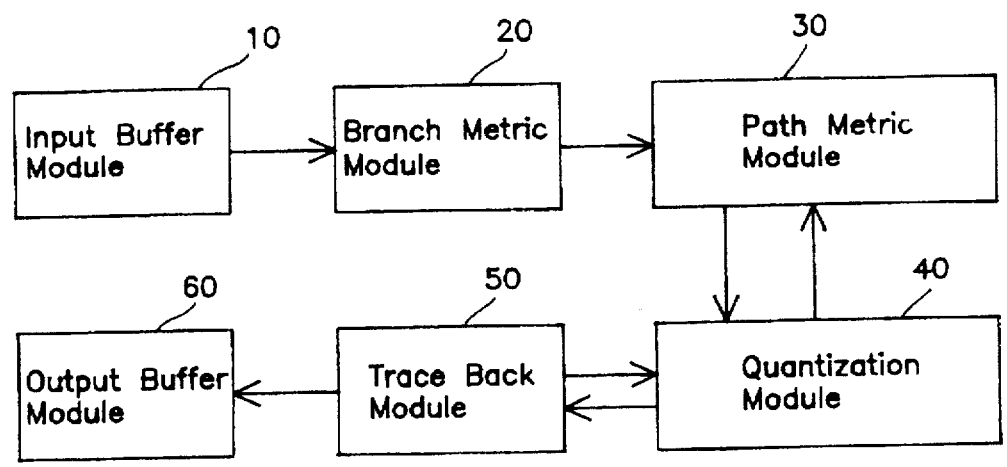
FIG. 2 illustrates the structure of the viterbi decoder comprising the channel decoder of the structure of FIG. 1 with the viterbi decoder.
Figure 6:
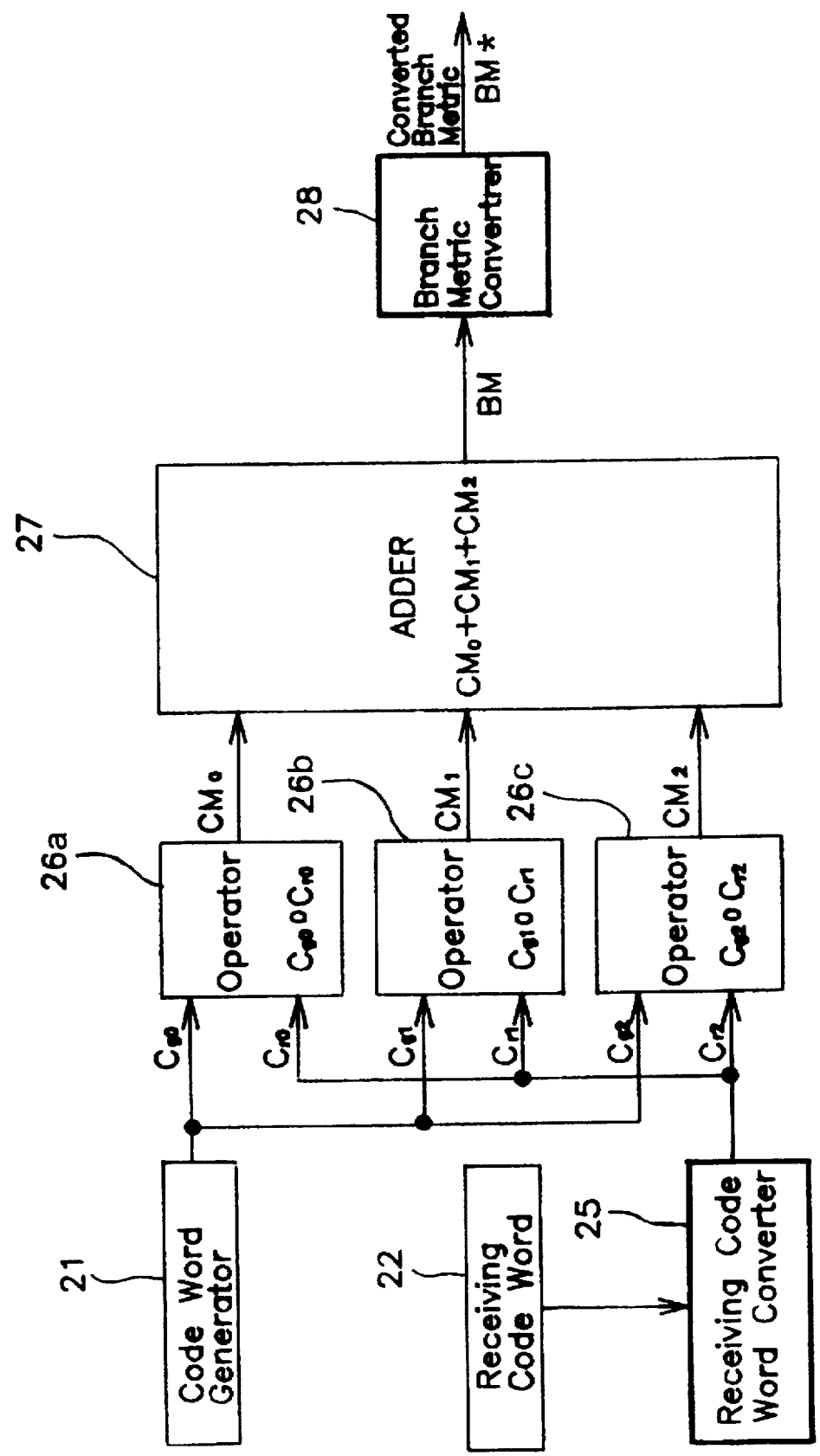
FIG. 6 illustrates the structure of the branch metric module to process the receiving data by the non-linear quantization method according to the linear quantization method of the present invention.

FIG. 6 illustrates a branch metric module invented on the basis of the technical event as mentioned hereinabove as follows. In FIG. 6, the reference numeral 21 refers to the code word generator to perform the viterbi decode, reference numeral 22 refers to the terminal for receiving a plurality of receiving code words from a source such as an input buffer module (FIG. 2), and the reference numeral 25 denotes the receiving code word converter for converting the signal by a non-linear quantization of the four bit soft-decided receiving code words.

The reference numerals 26a, 26b and 26c respectively refer to the first, second, and third operators which respectively output the signals $CM_0$, $CM_1$, and $CM_2$ of the five and six bits to calculate the difference between each of the code words $C_{g0}$, $C_{g1}$, and $C_{g2}$ generated by code word generator 21 and each of the receiving code words $C_{r0}$, $C_{r1}$ and $C_{r2}$ converted by the receiving code word converter 25.

The reference numeral 27 denotes an adder of the seven and eight bits for calculating the branch metric to sum the outputs $CM_0$, $CM_1$ and $CM_2$ of the first, second and third operators, and the reference numeral 28 denotes a branch metric converter for obtaining the branch metric value (BM*).converted by converting the branch metric from adder 27. That is, the structure of the present invention comprises the receiving code word converter 25 which is interposed between the receiving code word terminal 22 and the operators 26a–26c, and the branch metric converter 28, which converts the calculated branch metric value in the state when the conventional branch metric module is not largely changed. Then, the branch metric converter 28 also performs the function to decrease the bit number of the branch metric in addition to the branch metric change as mentioned hereinabove.

Tables 1 and 2, set forth below, indicate the data according to the input and output operational feature of the receiving code converter 25.

Referring to Table 1, the relationship of the receiving code word converter for converting each of the four bit soft-decided receiving code words to five bits is illustrated.

TABLE 1

| receiving code word | | receiving code word converter output | |
|---|---|---|---|
| decimal | binary | decimal | binary |
| +7 | 0111 | +7.0 | 01110 |
| +6 | 0110 | +6.5 | 01101 |
| +5 | 0101 | +5.5 | 01011 |
| +4 | 0100 | +4.5 | 01001 |
| +3 | 0011 | +2.5 | 00101 |
| +2 | 0010 | +1.5 | 00011 |
| +1 | 0001 | +0.5 | 00001 |
| 0 | 0000 | 0.0 | 00000 |
| −1 | 1111 | −0.5 | 11111 |
| −2 | 1110 | −1.5 | 11101 |
| −3 | 1101 | −2.5 | 11011 |
| −4 | 1100 | −4.5 | 10111 |
| −5 | 1011 | −5.5 | 10101 |
| −6 | 1010 | −6.5 | 10011 |
| −7 | 1001 | −7.0 | 10010 |

Each of the receiving code words has a minimum value of 1, and has a range from "−7" to "+7".

Then, the receiving code word converter 25 is constructed to output the value corresponding to the value of each of the receiving code words according to the data in table 1.

The output value of the receiving code word converter 25 has a minimum value of 0.5, and has a range from "−7" to "+7". That is, each of the converted receiving code words of the five bits has a minimum increment of 0.5.

The example mentioned hereinabove estimates the magnitude of the converting bit at a level of five bits. The construction of receiving code word converter 27 if each of the four bit soft-decided receiving code words is converted to six bits is as shown in the following Table 2.

TABLE 2

| receiving code word | | receiving code word converter output | |
|---|---|---|---|
| decimal | binary | decimal | binary |
| +7 | 0111 | +7.00 | 011100 |
| +6 | 0110 | +6.25 | 011001 |
| +5 | 0101 | +5.00 | 010100 |
| +4 | 0100 | +3.00 | 001100 |
| +3 | 0011 | +1.50 | 000101 |
| +2 | 0010 | +0.75 | 000011 |
| +1 | 0001 | +0.25 | 000001 |
| 0 | 0000 | 0.0 | 000000 |
| −1 | 1111 | −0.25 | 111111 |
| −2 | 1110 | −0.75 | 111101 |
| −3 | 1101 | −1.50 | 111011 |
| −4 | 1100 | −3.00 | 110100 |
| −5 | 1011 | −5.00 | 101100 |
| −6 | 1010 | −6.25 | 100111 |
| −7 | 1001 | −7.00 | 100100 |

Changing the bits as mentioned hereinabove into six bits yields a value with a minimum increment of 0.25.

By changing the number of bits in the converted word in a manner as indicated in Tables 1 and 2, that is, changing the receiving code word into seven bits or more, yields a smaller gain as compared with the bit increment.

Referring to Tables 1 and 2, the portions indicating both end values +7/−7 and the portion indicating the central value +1, 0, and −1 have a small change in the output with respect to the change of the input, and the area indicating the central value +4 and −4 is large with respect to the change of the input.

The resolution is high when calculating the branch metric by converting the four bits of the receiving code word into five bits or six bits.

The hardware to input and output the data or structure the system, i.e. the receiving code word converter 25, is easily constructed by using a logic circuit or ROM.

The number of bits of receiving code word converter 25 is greater than the number of bits of the receiving code word, so that operator 26 and adder 27 which are used in the branch metric module have a larger number of bits than the general number of bits.

Such an increment of the bit length is due to the process down decimals, but because the required circuitry occupies a small portion as compared with the main circuit, the increment of the logic circuit due to the increased number of bits can be disregarded.

A branch metric converter 28 converts the output data of adder 26 to match the system and will be now discussed.

First, the changed branch metric (BM*) is obtained by changing the branch metric value according to one feature of the branch metric as mentioned hereinabove after the branch metric (BM) of the enlarged bit is obtained.

The input and output features of branch metric converter 28 is indicated in the following Tables 3 and 4.

TABLE 3

| branch metric | | | branch metric converter output | |
|---|---|---|---|---|
| decimal | increment | 7 bit | decimal | binary |
| 38.50–42.00 | 2.00 | 1001101–1010100 | 15 | 1111 |
| 36.50–38.00 | 2.50 | 1001001–1001100 | 14 | 1110 |
| 34.00–36.00 | 3.00 | 1000100–1001000 | 13 | 1101 |
| 31.00–33.50 | 3.00 | 0111110–1000011 | 12 | 1100 |
| 28.00–30.50 | 4.00 | 0111000–0111101 | 11 | 1011 |
| 24.00–27.50 | 5.00 | 0110001–0110111 | 10 | 1010 |
| 19.00–23.50 | 5.00 | 0100110–0101111 | 9 | 1001 |
| 14.00–18.50 | 4.00 | 0011100–0100101 | 8 | 1000 |
| 10.00–13.50 | 3.00 | 0010100–0011011 | 7 | 0111 |
| 7.00–9.50 | 2.50 | 0001110–0010011 | 6 | 0110 |
| 4.50–6.50 | 2.00 | 0001001–0001101 | 5 | 0101 |
| 2.50–4.00 | 1.00 | 0000101–0001000 | 4 | 0100 |
| 1.50–2.00 | 0.50 | 0000011–0000100 | 3 | 0011 |
| 1.00 | 0.50 | 0000010 | 2 | 0010 |
| 0.50 | 0.50 | 0000001 | 1 | 0001 |
| 0.00 | 0.00 | 0000000 | 0 | 0000 |

TABLE 4

| branch metric | | | branch metric converter output | |
|---|---|---|---|---|
| decimal | increment | 8 bit | decimal | binary |
| 38.25–42.00 | 2.00 | 10011001–10101000 | 15 | 1111 |
| 36.25–38.00 | 2.50 | 10010001–10011000 | 14 | 1110 |
| 33.75–35.00 | 3.00 | 10000111–10010000 | 13 | 1101 |
| 30.75–33.50 | 3.00 | 01111011–10000110 | 12 | 1100 |
| 27.75–30.50 | 4.00 | 01101111–01111010 | 11 | 1011 |
| 23.75–27.50 | 5.00 | 01011111–01101110 | 10 | 1010 |
| 18.75–23.50 | 5.00 | 01001011–01011110 | 9 | 1001 |
| 13.75–18.50 | 4.00 | 00110111–01001010 | 8 | 1000 |
| 9.75–13.50 | 3.00 | 00100111–00110110 | 7 | 0111 |
| 6.75–9.50 | 2.50 | 00011011–00100110 | 6 | 0110 |
| 4.25–6.50 | 2.00 | 00010001–00011010 | 5 | 0101 |
| 2.25–4.00 | 1.50 | 00001001–00010000 | 4 | 0100 |
| 1.75–2.00 | 1.00 | 00000111–00001000 | 3 | 0011 |
| 0.75–1.00 | 0.50 | 00000011–00000110 | 2 | 0010 |
| 0.25 | 0.25 | 00000001 | 1 | 0001 |
| 0.00 | 0.00 | 00000000 | 0 | 0000 |

Tables 3 and 4 illustrate the branch metric converting tables depending on whether the receiving code word converter 25 is five bits (corresponding to Table 3 in the conversion according to Table 2) and six bits (corresponding to Table 4 in the conversion according to Table 2), respectively.

Referring to Tables 3 and 4, the branch metric before conversion has "7" bits and "8" bits, respectively, and thus it provides an output by converting the branch metric value into "4" bits to equal the bit number of the receiving code word.

The branch metric value before conversion has a maximum value of 42, and thus the around value thereof is little affected by an error correction although it compresses and changes at the small upper area because the probability of an included error is very high.

The branch metric value around the central value 21 indicates that the correctness of the receiving code word is more ambiguous so that the output value of the converter according to the change of the branch metric in this area is reflected as being very small.

The area indicating that the minimum value is high has a probability such that the receiving signal can be the same as the transmitted one, so that it reflects to the converted branch metric (BM*) converted by correctly dividing it into several increments, thus increasing the similar path generation.

A new branch metric module structure is constructed by using the receiving code word converter 25 and the branch metric converter 28 as mentioned hereinabove, so that the performance of the viterbi decoder is improved.

The branch metric module of the viterbi decoder according to the present invention results in an increase in the size by one bit or two bits of the operator and the adder as compared with the conventional components, and additionally add the receiving code word converter and the branch metric converter. However, the resultant branch metric value can decrease the magnitude of the ACS (Add-Compare-Select) of the path metric by equaling the four soft-decision magnitude, thus permitting the disregarding of the change of the dimensions.

The present branch metric module also provides the advantage that the performance of the viterbi decoder can be enhanced by the receiving code word converter by considering the features of the receiving code word, the branch metric, and the branch metric converter.

While the foregoing discloses the preferred embodiment of the invention, it is to be understood that many changes in the details may be made as a matter of engineering choices without departing from the spirit and scope of the invention as defined by the appended claims. Therefore, all such changes, modifications, variations, and other uses and applications which do not depart from he spirit and scope of this invention are deemed to be covered by this invention, which is limited only by the claims which follow.

What is claimed is:

1. A branch metric module of a viterbi decoder that includes generator means for generating a branch metric value comprising:

a receiving code word converter means for converting the bit magnitude of a received code word by non-linearly converting said received code word in accordance with a first predetermined format to produce a converted received code word;

a calculator means for calculating the absolute value of a combination of three combined pairs of said convened received code word and the generated code word; and a branch metric converter means for converting the output from said calculator means according to a second predetermined format to produce a converted branch metric data.

2. The branch metric module of the viterbi decoder of claim 1 wherein said calculating means comprises:

an operator means for calculating the absolute value of the difference between said converted received code word and the generated branch metric value; and an adder means for summing a plurality of calculated differences from said operator means.

3. The branch metric module of the viterbi decoder of claim 2, characterized in that said code word converter means performs a non-linear quantization of the received code word which has end portions and a central portion and has a linear quantization portion, wherein the change of the central portion of the received code word which originally has a large probability to have an error decreases the effect for the converted branch metric data, and the change of both end portion of the received code word which originally has a small probability to have an error decreases the effect for the converted branch metric data, and the change of the linear quantization portion of the received code word which originally has a medium probability to have an error increases the effect for the converted branch metric data.

4. The branch metric module of the viterbi decoder of claim 2, characterized in that said code word converter means converts said received code word such that the branch metric value around the maximum value has a larger value, such that the branch metric value around the minimum value has a more divided value, such that the ambiguous portion is small with respect to the change of the branch metric value, and such that a remainder portion sufficiently reflects the change of the branch metric data.

5. The branch metric module of the viterbi decoder of claim 2, characterized in that said received code word has four bits, the output of said receiving code word converter means has five bits, and the incremental value of said converted received code word is 0.5 if the incremental value of said received code word is 1.

6. The branch metric module of the viterbi decoder of claim 2, characterized in that said received code word has four bits, the output of said receiving code word converter means has six bits, and the incremental value of said converted received code word is 0.25 if the incremental value of said received code word is 1.

7. The branch metric module of the viterbi decoder of claim 2, characterized in that the bit magnitude of the original received code word is four bits, the bit magnitude of the output from said adder means is seven bits if the bit magnitude of the output from said receiving code word converter means is five bits, said branch metric converter means outputs the value representing an area selected according to the predetermined format, and the bit magnitude of said branch metric converter means output is four bits.

8. The branch metric module of the viterbi decoder of claim 2, characterized in that the bit magnitude of the original received code word is four bits, the bit magnitude of the output from said adder means is eight bits if the bit magnitude of the output from said receiving code word converter means is six bits, said branch metric converter means outputs the value representing an area selected according to the predetermined format, and the bit magnitude of said branch metric converter means output is four bits.

9. The branch metric module of the viterbi decoder of claim 2 wherein said branch metric converter means converts the output from said adder means back to the bit magnitude of the received code word in accordance with said second predetermined format, said branch metric converter means converts the output from said adder means back to the bit magnitude of the received code word in accordance with said second predetermined format.

10. The branch metric module of the viterbi decoder of claim 9 wherein said receiving code word converter means includes a read only memory which stores a conversion table.

* * * * *